(12) United States Patent
Dominguez

(10) Patent No.: US 8,817,936 B2
(45) Date of Patent: Aug. 26, 2014

(54) MULTIPLE SYNCHRONOUS IQ DEMODULATORS

(75) Inventor: David Charles Dominguez, Foothill Ranch, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/478,790

(22) Filed: May 23, 2012

(65) Prior Publication Data

US 2013/0315289 A1    Nov. 28, 2013

(51) Int. Cl.
*H04L 7/00*    (2006.01)
(52) U.S. Cl.
USPC ........... 375/371; 375/148; 375/232; 375/324; 375/219; 375/298; 375/347; 375/350
(58) Field of Classification Search
CPC ..... H04L 7/033; H04L 7/0337; H04L 7/0338; H03L 7/0814; G06F 1/10
USPC ......... 375/371, 148, 219, 232, 298, 324, 347, 375/350; 455/86, 132, 139, 323
See application file for complete search history.

(56) References Cited

U.S. PATENT DOCUMENTS

| | | | |
|---|---|---|---|
| 5,565,816 A | 10/1996 | Coteus | |
| 6,630,855 B2 | 10/2003 | Fayneh et al. | |
| 7,221,718 B2 | 5/2007 | Park | |
| 7,514,993 B2 | 4/2009 | Konchitsky | |
| 2003/0109242 A1* | 6/2003 | Ohtaki | 455/335 |
| 2006/0068746 A1* | 3/2006 | Feng et al. | 455/323 |
| 2007/0200618 A1 | 8/2007 | Konchitsky | |
| 2008/0205499 A1 | 8/2008 | Ridel et al. | |
| 2012/0092205 A1* | 4/2012 | Bourdelais et al. | 342/21 |

FOREIGN PATENT DOCUMENTS

EP    0208284 A3    1/1987

OTHER PUBLICATIONS

Combined Search and Examination Report for UK Application No. GB1308793.7, dated Nov. 13, 2013.

* cited by examiner

*Primary Examiner* — Dhaval Patel
(74) *Attorney, Agent, or Firm* — Klintworth & Rozenblat IP LLC

(57) ABSTRACT

A system for synchronizing IQ demodulators includes IQ demodulators, phase-controlling devices, a reference signal, a phase detector, and a control device. The phase-controlling devices are each associated with one of the IQ demodulators for outputting an output signal to its associated IQ demodulator having a phase controlled by the associated phase-controlling device. The phase detector is in communication with the output signals for determining whether the phase of any of the output signals is out-of-phase with a reference phase of the reference signal. The control-device is in communication with the phase-controlling devices programmed, internally or externally, to send a control signal to the associated phase-controlling device for any of the output signals which are out-of-phase with the reference phase of the reference signal so that the associated phase-controlling device synchronizes the phase of the output signal to being in-phase with the reference phase of the reference signal.

26 Claims, 3 Drawing Sheets

MULTIPLE SYNCHRONOUS IQ DEMODULATORS

FIELD OF THE DISCLOSURE

The disclosure relates to systems and methods for synchronizing multiple IQ demodulators.

BACKGROUND OF THE DISCLOSURE

It is desirable to synchronize multiple IQ demodulators. One previous method for synchronizing multiple IQ demodulators was to use a common clock for each IQ demodulator circuit. However with this approach there can be unacceptable clock skew when the IQ demodulator is operated at frequencies above 70 MHz or if the circuits which are performing the IQ demodulation are separated by a distance of greater than one foot. Another previous method for synchronizing multiple IQ demodulators was to use multiple clocks for the IQ demodulator circuit and to provide a data collection means to determine if each IQ demodulator was operating in the same phase. If the clocks were not operating in-phase for each IQ demodulator, the clocks had to be restarted until they were in-phase. This can be inefficient and timely.

There is a need for a system and method for synchronizing multiple IQ demodulators while avoiding one or more problems encountered in one or more of the previous systems or methods.

SUMMARY OF THE DISCLOSURE

In one embodiment, a system is disclosed for synchronizing IQ demodulators. The system includes a plurality of IQ demodulators, a plurality of phase-controlling devices, a reference signal, a phase detector, and a control device. The plurality of phase-controlling devices are each associated with one of the plurality of IQ demodulators for outputting an output signal to its associated IQ demodulator having a phase controlled by the associated phase-controlling device. The reference signal includes a reference phase. The phase detector is in communication with the output signals for determining whether the phase of any of the output signals is out-of-phase with the reference phase of the reference signal. The control-device is in communication with the plurality of phase-controlling devices programmed, internally or externally, to send a control signal to the associated phase-controlling device for any of the output signals which are out-of-phase with the reference phase of the reference signal so that the associated phase-controlling device synchronizes the phase of the output signal to being in-phase with the reference phase of the reference signal.

In another embodiment, a method for synchronizing IQ demodulators is disclosed. In one step, signals are outputted from a plurality of phase-controlling devices to respective associated IQ demodulators. In another step, phases of the outputted signals are compared using a phase detector to determine whether the phase of any of the output signals is out-of-phase with a reference phase of a reference signal. In an additional step, a control signal is sent from a control-device to the associated phase-controlling device for any of the output signals which are out-of-phase with the reference phase of the reference signal so that the associated phase-controlling device synchronizes the phase of the output signal to being in-phase with the reference phase of the reference signal.

These and other features, aspects and advantages of the disclosure will become better understood with reference to the following drawings, description and claims.

DETAILED DESCRIPTION OF THE DISCLOSURE

The following detailed description is of the best currently contemplated modes of carrying out the disclosure. The description is not to be taken in a limiting sense, but is made merely for the purpose of illustrating the general principles of the disclosure, since the scope of the disclosure is best defined by the appended claims.

Figure 1:
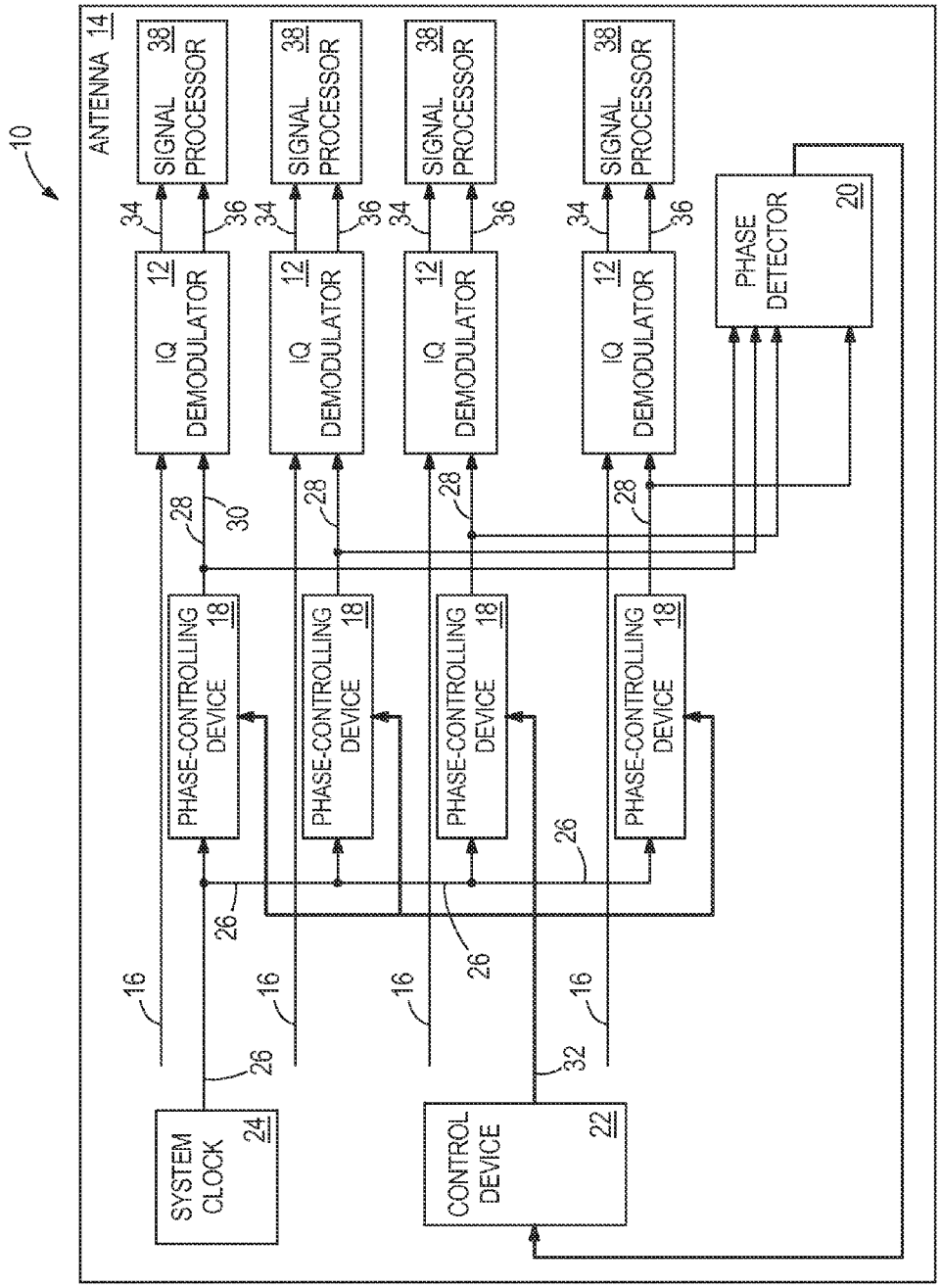
FIG. 1 illustrates a block diagram of a system for synchronizing IQ demodulators.

FIG. 1 illustrates a block diagram of a system 10 for synchronizing IQ (In-Phase and Quadrature-Phase) demodulators 12. The system 10 comprises a radar system comprising an antenna 14 and at least four channels 16 with each of the channels 16 being associated with one of the IQ demodulators 12. The system 10 synchronizes each of the IQ demodulators 12 so that each of the channels 16 associated with the IQ demodulators 12 are put into the same phase. In other embodiments, the system 10 may comprise a radar system, a radio system, a sonar system, a cell phone system, a medical imagining system, or any type of system having a need for synchronized IQ demodulators with any number of channels, such as two or more, which are put into the same phase. The system 10 comprises a plurality of IQ demodulators 12, a plurality of phase-controlling devices 18, a phase detector 20, a control-device 22, and a system clock 24. In other embodiments, the system 10 may comprise varying components. The components of the system 10 may comprise multiple modules separated by some distance or may be implemented in an ASIC (Application Specific Integrated Circuit) or an FPGA (Field Programmable Gate Array). The system 10 may be analog, digital, or a combination of both.

The system clock 24 outputs a system signal 26 to the plurality of phase-controlling devices 18. The system clock 24 is disposed at different distances relative to the plurality of IQ demodulators 12. The components of the system 10 may be separated by distances greater than 1 foot. In other embodiments, the components of the system 10 may be separated by varying distances. The IQ demodulators 12 may be operated at frequencies above 70 MHz. In other embodiments, the IQ demodulators 12 may be operated at varying frequencies. The plurality of phase-controlling devices 18 each regenerate the system signal 26 and output an output signal 28, comprising the regenerated system signal, to an associated IQ demodulator 12 with the phase of the output signal 28 controlled by the associated phase-controlling device 18. The plurality of phase-controlling devices 18 may each comprise a PLL (phase-lock loop). One of the output signals 28 is selected as a reference signal 30 comprising a reference phase. In other embodiments, any of the output signals 28 may be selected as the reference signal 30. The phase detector 20 is in communication with the output signals 28 for determining whether the phase of any of the output signals 28 is out-of-phase with the reference phase of the reference signal 30.

The control-device 22 is in communication with the plurality of phase-controlling devices 18 and is programmed, internally or externally, to send a control signal 32 to the associated phase-controlling device 18 for any of the output signals 28 which are out-of-phase with the reference phase of the reference signal 30 so that the associated phase-controlling device 18 synchronizes the phase of the output signal 28 to being in-phase with the reference phase of the reference signal 30. The control-device 22 may reset each phase-controlling device 18 which is outputting an output signal 28 which is out-of-phase with the reference phase of the reference signal 30 so that the output signal 28 is reset to being in-phase with the reference phase of the reference signal 30. In another embodiment, a control word may be used to program the phase of the output signal 28 being outputted by any control device 22 outputting an output signal 28 which is out-of-phase with the reference phase of the reference signal 30 so that the output signal 28 becomes in-phase with the reference phase of the reference signal 30. The control-device 22 may comprise a PLL (phase-lock-loop) control comprising a processor. In other embodiments, any of the components of the system 10 may comprise or be connected to a processor. In such manner, the IQ demodulators 12 may be automatically synchronized so that all of their channels 16 are equalized and in-phase with one another. Using the output signals 28, the IQ demodulators 12 may each generate sine and cosine signals which are used to create and output an in-phase real part of a signal 34 and a quadrature-phase imaginary part of a signal 36. Each of the IQ demodulators 12 may be in communication with a signal processor 38 for processing the signals 34 and 36 of the IQ demodulators 12.

Figure 2:
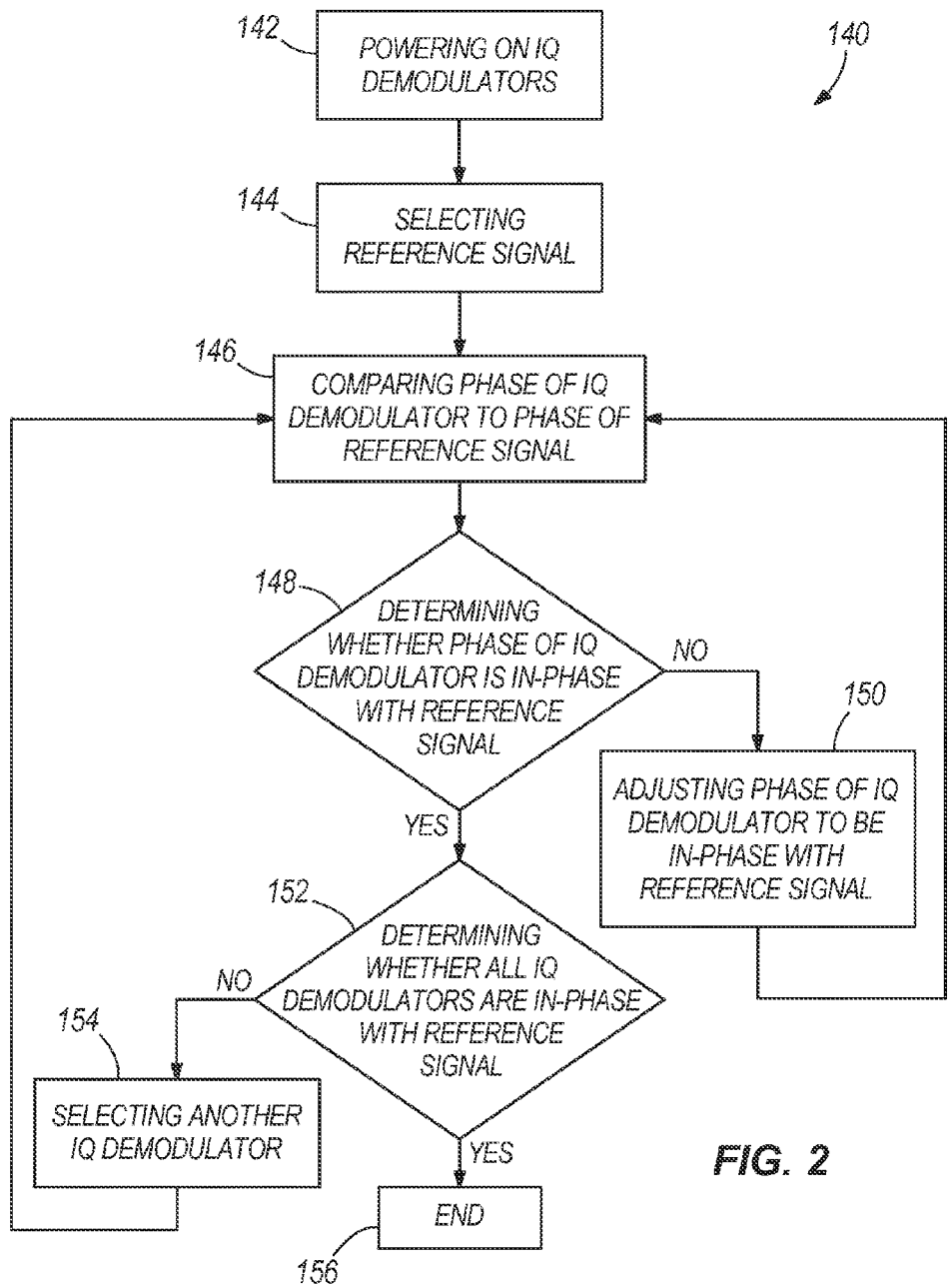
FIG. 2 illustrates a flow-chart of a method for synchronizing IQ demodulators.

FIG. 2 illustrates a flow-chart 140 of a method for synchronizing IQ demodulators. In step 142 the IQ demodulators are powered on. Next in step 144 one of the signals being outputted to one of the IQ demodulators is selected as being the reference signal having a reference phase. Next in step 146 the phase of one of the signals being outputted to one of the IQ demodulators is compared to the reference phase of the reference signal. Next in step 148 a determination is made as to whether the phase of the signal being outputted to the one IQ demodulator in step 146 is the same as the reference phase of the reference signal.

If the determination of step 148 is 'no' then the method proceeds to step 150 and adjusts the phase of the signal being outputted to the one IQ demodulator of step 146 to be in-phase with the reference phase of the reference signal. Next the method proceeds back to step 146 and compares the adjusted phase of the signal being outputted to the IQ demodulator to the reference phase of the reference signal to ensure that it is now the same as the reference phase of the reference signal. Next in step 148 a determination is made as to whether the adjusted phase of the signal being outputted to the IQ demodulator is the same as the reference phase of the reference signal. If the determination of step 148 is again 'no' then the method proceeds to step 150 and continues the loop over again.

If the determination of step 148 is 'yes' then the method proceeds to step 152 and determines whether all IQ demodulators have been tested to see whether they are all in-phase with the reference phase of the reference signal. If the determination of step 152 is 'no' then the method proceeds to step 154 and selects another IQ demodulator. Next the method proceeds back to step 146 and compares the phase of the signal being outputted to the IQ demodulator selected in step 154 to the reference phase of the reference signal. Next in step 148 a determination is made as to whether the phase of the signal being outputted to the IQ demodulator selected in step 154 is the same as the reference phase of the reference signal. If the determination of step 148 is 'no' then the method proceeds to step 150 and continues the loop over again.

If the determination of step 152 is 'yes' then the method proceeds to step 156 and ends the method since the signals of all of the IQ demodulators are now in-phase.

Figure 3:
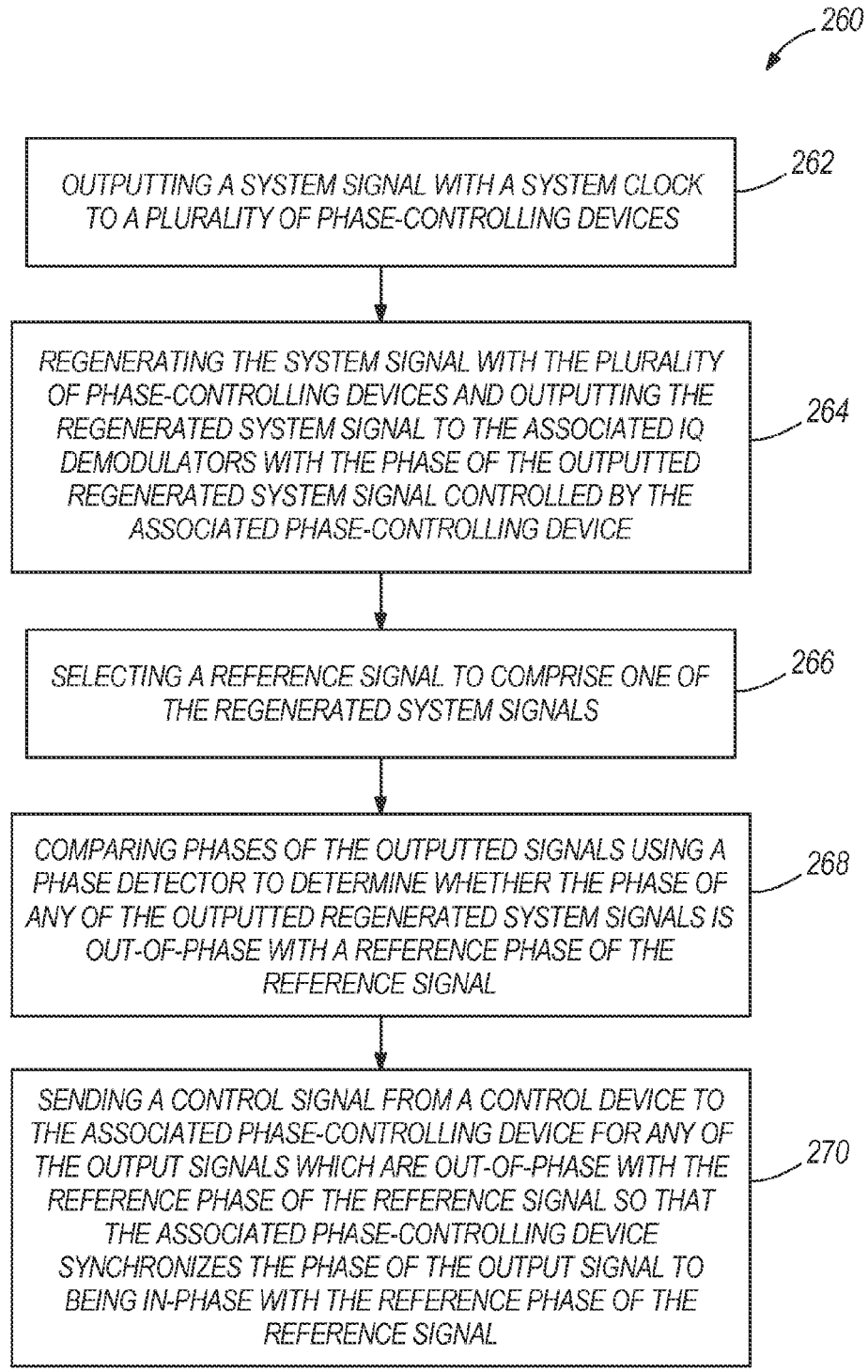
FIG. 3 illustrates a flow-chart of a method for synchronizing IQ demodulators

FIG. 3 illustrates a flow-chart 260 of a method for synchronizing IQ demodulators. The method may be used to synchronize IQ demodulators in a radar system, a sonar system, a radio system, a cell phone system, a medical imaging system, or in another type of system. Each IQ demodulator may comprise its own channel which needs to be equalized to the channels of the other IQ demodulators so that all channels are in-phase. In step 262 a system clock outputs a system signal to a plurality of phase-controlling devices. The system clock may be disposed at different distances relative to the IQ demodulators. In step 264 the plurality of phase-controlling devices each regenerate the system signal and output the regenerated system signal (comprising an output signal) to its associated IQ demodulator with the phase of the outputted regenerated system signal controlled by the associated phase-controlling device. The plurality of phase-controlling devices may each comprise a phase-lock loop. In other embodiments, the plurality of phase-controlling devices may vary. In step 266 a reference signal is selected to comprise one of the output signals (one of the regenerated system signals).

In step 268 phases of the outputted signals are compared using a phase detector to determine whether the phase of any of the output signals is out-of-phase with a reference phase of the reference signal. In step 270 a control signal is sent from a control device to the associated phase-controlling device for any of the output signals which are out-of-phase with the reference phase of the reference signal so that the associated phase-controlling device synchronizes the phase of the output signal to being in-phase with the reference phase of the reference signal. The control-device may comprise a phase-lock-loop control or a processor. In other embodiments, the control-device may vary. The IQ demodulators may use the output signals to generate sine and cosine signals which are used to create and output in-phase real parts of signals and quadrature-phase imaginary parts of signals. In one embodiment, step 270 may comprise synchronizing IQ demodulators in a radar system comprising an antenna and at least four channels with each of the channels being associated with one of the IQ demodulators so that each of the channels are equalized to have the same phase. In other embodiments, step 270 may synchronize IQ demodulators in varying systems having a varying number of channels, such as two or more, which are put into the same phase.

One or more embodiments of the disclosure may synchronize multiple IQ demodulators while avoiding one or more problems encountered in one or more of the previous systems or methods. The disclosure allows for the automatic synchronization of multiple IQ demodulators by eliminating the clock phase differences which is a problem encountered by some of the prior art systems and methods. The disclosure improves on prior methods which utilize a single clock to multiple IQ demodulators by eliminating phase differences which occur when multiple IQ demodulators are located at different distances from the clock source. The disclosure also eliminates the need to collect data from the multiple IQ demodulators in order to determine the phase difference as required by some methods of the prior art. The disclosure also allows the IQ demodulators to be located at varying distances relative to a clock source, and to be operated at varying frequencies, while keeping the IQ demodulators in-phase.

It should be understood, of course, that the foregoing relates to exemplary embodiments of the disclosure and that modifications may be made without departing from the spirit and scope of the disclosure as set forth in the following claims.

I claim:

1. A system for synchronizing IQ demodulators comprising:
   a plurality of IQ demodulators;
   a plurality of phase-controlling devices each associated with one of the plurality of IQ demodulators for outputting an output signal to its associated IQ demodulator having a phase controlled by the associated phase-controlling device;
   only one system clock in communication with the plurality of phase-controlling devices, the only one system clock configured to output to each of the plurality of phase-controlling devices a system signal;
   a reference signal comprising a reference phase;
   a phase detector in communication with the output signals for determining whether the phase of any of the output signals is out-of-phase with the reference phase of the reference signal; and
   a control-device comprising a processor in communication with the phase detector and with the plurality of phase-controlling devices programmed, internally or externally, to send a control signal to the associated phase-controlling device for any of the output signals which are out-of-phase with the reference phase of the reference signal so that the associated phase-controlling device synchronizes the phase of the output signal to being in-phase with the reference phase of the reference signal.

2. The system of claim 1 wherein the plurality of phase-controlling devices each comprises a phase-lock loop, and the control-device comprises a phase-lock-loop control.

3. The system of claim 1 wherein the reference signal comprises one of the output signals.

4. The system of claim 1 wherein the plurality of phase-controlling devices each regenerate the system signal and output the regenerated system signal to its associated IQ demodulator with the phase of the outputted regenerated system signal controlled by the associated phase-controlling device.

5. The system of claim 1 wherein the only one system clock is disposed at different distances relative to the plurality of IQ demodulators.

6. The system of claim 1 wherein each IQ demodulator comprises its own channel.

7. The system of claim 1 wherein the only one system clock is in direct communication with each of the plurality of phase-controlling devices.

8. The system of claim 1 wherein the system comprises at least one of a radar system, a sonar system, a radio system, a cell phone system, or a medical imaging system.

9. The system of claim 1 wherein the system comprises a radar system comprising an antenna and at least two channels with each of the channels being associated with one of the IQ demodulators, and the system is configured to equalize each of the channels to have the same phase.

10. A method for synchronizing IQ demodulators comprising:
    only one system clock outputting a system signal to each of a plurality of phase-controlling devices;
    outputting signals from the plurality of phase-controlling devices to respective associated IQ demodulators;
    comparing phases of the outputted signals using a phase detector to determine whether the phase of any of the outputted signals is out-of-phase with a reference phase of a reference signal;
    communicating between the phase detector and a control device comprising a processor with the phase detector informing the control device of the determination of the phase detector; and
    sending a control signal from the control-device to the associated phase-controlling device for any of the outputted signals which are out-of-phase with the reference phase of the reference signal so that the associated phase-controlling device synchronizes the phase of its outputted signal to being in-phase with the reference phase of the reference signal.

11. The method of claim 10 wherein the plurality of phase-controlling devices each comprises a phase-lock loop, and the control-device comprises a phase-lock-loop control.

12. The method of claim 10 further comprising selecting the reference signal to comprise one of the outputted signals.

13. The method of claim 10 further comprising the plurality of phase-controlling devices each regenerating the system signal and outputting the regenerated system signal to its respective associated IQ demodulator with the phase of the outputted regenerated system signal controlled by the associated phase-controlling device.

14. The method of claim 10 wherein the only one system clock is disposed at different distances relative to the respective associated IQ demodulators.

15. The method of claim 10 wherein each respective associated IQ demodulator comprises its own channel.

16. The method of claim 10 further comprising the only one system clock directly communicating with each of the plurality of phase-controlling devices.

17. The method of claim 10 further comprising synchronizing the respective associated IQ demodulators in at least one of a radar system, a sonar system, a radio system, a cell phone system, or a medical imaging system.

18. The method of claim 10 further comprising synchronizing the respective associated IQ demodulators in a radar system comprising an antenna and at least two channels with each of the channels being associated with one of the respective associated IQ demodulators, and further comprising equalizing each of the channels to have the same phase.

19. The system of claim 1 wherein the only one system clock, the phase detector, the control device, and the plurality of phase-controlling devices are the only components of the system which are used to synchronize the phase of the output signals.

20. The method of claim 10 wherein the synchronizing of the phase of the outputted signals is done using only the one system clock, the phase detector, the control device, and the plurality of phase-controlling devices without using any other components.

21. The system of claim 1 wherein the phase detector is in communication with the output signals, for determining whether the phase of any of the output signals is out-of-phase with the reference phase of the reference signal, prior to the output signals reaching the plurality of IQ demodulators.

22. The system of claim 21 wherein the phase detector, the control-device, and the plurality of phase-controlling devices collectively are configured to detect whether any of the output signals are out-of-phase with the reference phase of the reference signal and to synchronize the phases of the output signals to being in-phase with the reference phase of the reference signal prior to the output signals reaching the plurality of IQ demodulators.

23. The system of claim 1 wherein the plurality of IQ demodulators operate at different frequencies.

24. The method of claim 10 further comprising the phase detector comparing the phases of the outputted signals, to determine whether the phase of any of the outputted signals is out-of-phase with the reference phase of the reference signal, prior to the outputted signals reaching the respective associated IQ demodulators.

25. The method of claim 24 further comprising the phase detector, the control-device, and the plurality of phase-controlling devices collectively determining whether the phase of any of the outputted signals are out-of-phase with the reference phase of the reference signal and synchronizing the phases of the outputted signals to being in-phase with the reference phase of the reference signal prior to the outputted signals reaching the respective associated IQ demodulators.

26. The method of claim 10 further comprising the respective associated IQ demodulators operating at different frequencies.

* * * * *